United States Patent [19]

Cort

[11] Patent Number: 4,818,957
[45] Date of Patent: Apr. 4, 1989

[54] FERRITE TOROID ISOLATOR

[75] Inventor: Robert W. Cort, Boise, Id.

[73] Assignee: Hewlett-Packard Company, Palo Alto, Calif.

[21] Appl. No.: 175,876

[22] Filed: Mar. 31, 1988

[51] Int. Cl.$^4$ .......................... H03H 7/01; H03H 7/24
[52] U.S. Cl. .................................. 333/12; 333/81 R; 333/181; 333/185
[58] Field of Search ................ 333/167, 12, 175–177, 333/181–185, 81 R

[56]   References Cited

U.S. PATENT DOCUMENTS

| | | | |
|---|---|---|---|
| 2,865,006 | 12/1958 | Sabaroff | 333/12 |
| 3,516,026 | 6/1970 | Curran et al. | 333/12 |
| 3,680,146 | 7/1972 | Leitner | 333/12 X |
| 4,126,370 | 11/1978 | Nijman | 333/182 X |

*Primary Examiner*—Marvin L. Nussbaum
*Attorney, Agent, or Firm*—Leslie G. Murray

[57]   ABSTRACT

A ferrite toroid retainer 10 provides an apparatus for retaining ferrite toroids 1 on an electrical cable 2 to prevent chafing of the cable's insulation. The device is constructed from an elastomer material. Ferrite toroid retainer 10 is constructed from a toroidal sleeve 11 having an inside diameter B equal to that of the outside diameter A of electrical cable 2. The outside diameter C of ferrite toroid retainer 10 is equal to that of the inside diameter F of ferrite toroid 1. A retaining ridge 12 is attached around the circumference of one end of toroidal sleeve 11 and has a tapered leading edge 13. Attached around the circumference of the opposite end of toroidal sleeve 11 is a non-tapered retaining ridge 15. Perpendicular edges 14 prevent ferrite toroids 1 from sliding off of toroidal sleeve 11.

9 Claims, 2 Drawing Sheets

FERRITE TOROID ISOLATOR

BACKGROUND OF THE INVENTION

1. Technical Field

This invention relates to ferrite shielding toroids as applied on cables. In particular, it relates to an apparatus for retaining one or more ferrite shielding toroids in a stationary arrangement on a cable.

2. Background Art

Ferrite shielding toroids, or as hereinafter referred to as ferrite toroids serve two purposes when surrounding an electrical wire or cable. Firstly, they provide a mechanism for shielding the wire or cable from a hostile magnetic environment. Secondly, they provide a low pass filter which attenuates frequencies in the megahertz range, normally between 10 and 100 MHz. By fitting a wire or cable with a ferrite toroid, a small inductor is constructed. The magnetic field of the ferrite toroid interacts with the magnetic field created by the current in the cable and any hostile magnetic fields in the immediate environment. The ferrite toroid essentially provides a lossy impedance in the cable which acts to decouple the cable from high frequencies.

A typical application might be in a computer printer, which has associated with it hostile high frequency magnetic fields, as do most high speed switching digital devices. The use of ferrite toroids for shielding the electrical lines in such an environment is old and well known. However, a unique situation arises in that wires and cables subject to motion and vibration which are fitted with ferrite toroids are prone to chafing of the cable insulation by the ferrite toroids. This results in deterioration of the insulation and eventually warrants replacement of the wiring.

LEITNER, ET AL., U.S. Pat. No. 3,680,146 teaches a high frequency antenna system which utilizes a plurality of ferrite toroids for the purpose of suppressing electromagnetic radiation. LEITNER teaches ferrite toroids having an inside diameter slightly larger than the outside diameter of the coaxial cable. This method is not new and is commonly used in a variety of individual applications. The problem with this method of fitting a cable with a ferrite toroid is that cables which are subject to vibration and movement experience chafing of their insulation by the ferrite toroids. Simply reducing the inside diameter of the ferrite toroids and thereby facilitating a snugger fit will not work because the ferrite toroid must be slid along the outside surface of the cable from a disconnected end to its final destination.

Accordingly, what is needed is an apparatus which holds a ferrite toroid in a stable position around the circumference of a cable and which prohibits the ferrite toroid from touching the insulation, thereby eliminating chafing problems. It is an object of this invention to provide a means for engaging a ferrite toroid in a stationary position around the circumference of a cable and at the same time prohibiting the ferrite toroid from contacting the insulation of the cable. A further object of the present invention is to provide a resilient apparatus capable of frictional engagement around the circumference of a cable which is easily installed and does not restrict the flexibility of the cable.

DISCLOSURE OF INVENTION

The ferrite toroid retainer provides an apparatus for the stationary engagement of any number of ferrite toroids on a wire or cable for preventing chafing of the cable's insulation by the ferrite toroids. In its first embodiment, the ferrite toroid retainer has a toroidal sleeve with an inside diameter substantially equal to that of the outside diameter of the cable. One end of the toroidal sleeve has a chamfered inner edge to facilitate sliding the toroidal sleeve onto a cable. The toroidal sleeve has an outside diameter substantially equal to that of the inside diameter of the ferrite toroid. A retaining ridge is attached to, and circumscribes the chamfered inner edge end of the toroidal sleeve, and further extends radially outward from the toroidal sleeve surface. This retaining ridge prevents the ferrite toroids from sliding off the toroidal sleeve. A second retaining ridge which has a tapered leading edge, circumscribes and is attached to, and extends radially outward from the remaining end of the toroidal sleeve. The leading edge of this retaining ridge is tapered to facilitate sliding a ferrite toroid over the retaining ridge and on to the attached toroidal sleeve. A compression notch is provided in the perimeter of the tapered retaining ridge which allows the retaining ridge to compress radially inward to facilitate the installation of a ferrite toroid. The length of the toroidal sleeve is determined by the combined width of the desired number of toroids. The entire device is manufactured from an elastomer and thereby provides for a resilient and flexible device which utilizes the inherently high coefficient of friction to frictionally engage both the cable and the ferrite toroids to hold them in the desired positions along the cable.

A second embodiment provides a toroidal sleeve, having an inside diameter slightly larger than that of the cable and an outside diameter slightly larger than that of the inside diameter of the ferrite toroid. A retaining ridge having a tapered leading edge is attached to, circumscribes and further extends radially outward from the toroidal sleeve surface at each end of the toroidal sleeve. Having tapered leading edges at both ends facilitates sliding a ferrite toroid onto the toroidal sleeve from either end. A slot is disposed longitudinally through the surface of the toroidal sleeve and through the two retaining ridges and is parallel to the longitudinal axis of the toroidal sleeve.

The slot provides for a method of installation which makes the device retrofittable, that is the device can be installed without disconnecting one end of the cable. The previously installed ferrite toroids can be slipped over the retaining edges and onto the toroidal sleeve. A second, and equally important, function of the slot is to provide a clamping means for frictionally engaging the toroidal sleeve on a cable. The width of the slot must be great enough such that when the ferrite toroids are slipped over the tapered retaining ridge and onto the toroidal sleeve, it causes the sleeve to constrict, thereby enhancing frictional engagement of the toroidal sleeve with the cable.

Again, the entire device is constructed from an elastomer to take advantage of its inherent characteristics.

BEST MODE FOR CARRYING OUT INVENTION

Figure 1:
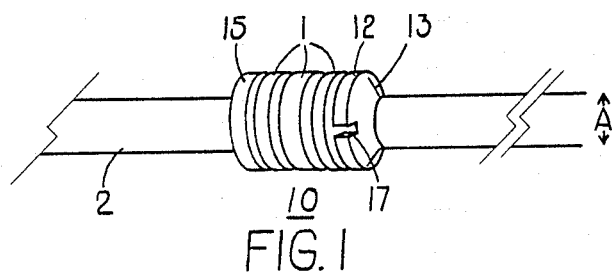
FIG. 1 is a representational perspective view of a ferrite toroid retainer and three ferrite toroids fitted on an electrical cable.
Figure 2:
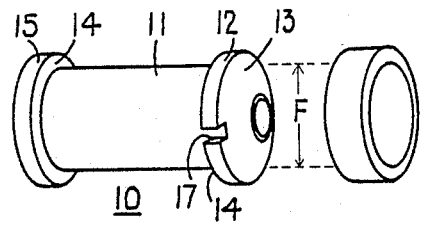
FIG. 2 is a representational perspective view of a ferrite toroid retainer and a ferrite toroid.
Figure 3:
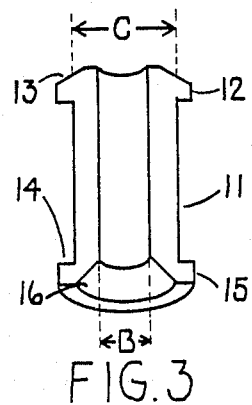
FIG. 3 is a cross-sectional perspective view of a ferrite toroid retainer.

An apparatus for holding a ferrite toroid 1 on a typical electrical cable 2 so as to prevent chafing of the insulation surrounding the electrical cable 2 is shown in FIGS. 1 through 3 and generally designated as 10 in its first embodiment.

Referring specifically to FIG. 1, a ferrite toroid retainer 10 is shown holding three ferrite toroids 1 on a typical electrical cable 2 of diameter A.

Referring also now to FIGS. 2 and 3, the ferrite toroid retainer 10 is constructed using a toroidal sleeve 11 of an elastomer material. The toroidal sleeve 11 has an inside diameter B which is equal to the outside diameter A of the electrical cable 2. The outside diameter C of toroidal sleeve 11 is equal to the inside diameter of F of ferrite toroid 1. The toroidal sleeve 11 has a retaining ridge 12 attached around the circumference of its front end and extending radially outward therefrom. Retaining ridge 12 has a tapered leading edge 13 to facilitate sliding the ferrite toroid 1 over retaining ridge 12 and onto toroidal sleeve 11. Compression notch 17, is provided in the perimeter of retaining ridge 12 and tapered leading edge 13, which allows the retaining ridge 12 to compress radially inward to facilitate the installation of a ferrite toroid 1 onto toroidal sleeve 11. A second non-tapered retaining ridge 15 is located at the opposite end of toroidal sleeve 11 and is attached around the circumference of the opposite end of toroidal sleeve 11, extending radially outward therefrom. The opposite end of toroidal sleeve 11 has a chamfered inner edge 16 to facilitate sliding the toroidal sleeve 1 onto cable 2. Perpendicular edges 14 provide a mechanism for prohibiting ferrite toroid 1 from slipping off of toroidal sleeve 11.

The ferrite toroid retainer 10 and a plurality of ferrite toroids 1 are installed on electrical cable 2 in the following manner. Ferrite toroids 1 are fitted onto ferrite toroid retainer 10 by sliding the ferrite toroids 1 one by one over tapered leading edge 13 and retaining ridge 12 onto toroidal sleeve 11. The electrical cable 2 is disconnected at one of its ends and the ferrite toroid retainer 10 is slid onto electrical cable 2. A suitable lubricant, such as a silicone based lubricant, may be used to facilitate this process. The ferrite toroid retainer 10 is slid along the cable to a desired location. Electrical cable 2 is then reconnected and the installation process is complete.

Figure 4:
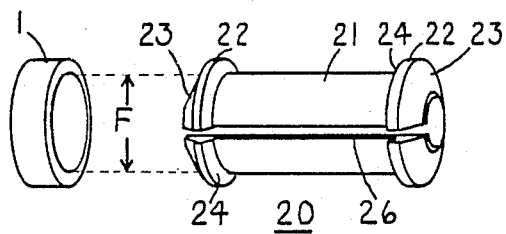
FIG. 4 is a representational perspective view of a second embodiment of the ferrite toroid retainer and a ferrite toroid.
Figure 5:
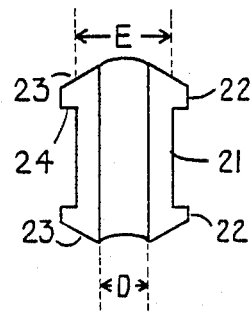
FIG. 5 is a cross-sectional perspective view of the second embodiment of the ferrite toroid retainer.

Referring now to FIGS. 1, 4 and 5, a second embodiment of the ferrite toroid retainer is generally designated as 20. Ferrite toroid retainer 20 is again constructed from an elastomer type material. Toroidal sleeve 21 has an inside diameter D slightly larger than the outside diameter A of electrical cable 2, and an outside diameter E slightly larger than the inside diameter F of ferrite toroid 1. Two opposing retaining ridges 22 are attached at opposite ends of toroidal sleeve 21 around its circumference and extend radially outward therefrom. Tapered leading edges 23 are provided on both retaining ridges 22 to facilitate sliding a ferrite toroid 1 over retaining ridges 22 and onto toroidal sleeve 21. In this second embodiment, ferrite toroids 1 can be slid onto toroidal sleeve 21 from either end of ferrite toroid retainer 20. Again, perpendicular retaining edges 24 are provided to prevent ferrite toroids 1 from sliding off of toroidal sleeve 21.

A slot 26 is disposed along one side of ferrite toroid retainer 20 parallel to its longitudinal axis and extends through the retaining ridges 22. Slot 26 provides a mechanism for retrofitting the ferrite toroid retainer 20 onto a electrical cable 2 without having to disengage one end of cable 2. Once ferrite toroid retainer 20 has been mounted on electrical cable 2, ferrite toroid 1 can be slid over tapered leading edge 23 and retaining ridge 22 onto toroidal sleeve 21. Since the outside diameter E of ferrite toroid retainer 20 is slightly larger than the inside diameter F of ferrite toroid 1, ferrite toroid 1 cause ferrite toroid retainer 20 to constrict around electrical cable 2 and thereby facilitates frictional engagement of ferrite toroid retainer 20 with electrical cable 2. In this manner, any electrical cable already having ferrite toroids 1 on it, may be retrofitted with a ferrite toroid retainer 20 to prevent further chafing of cable insulation.

While there is shown and described the present preferred embodiment of the invention, it is to be distinctly understood that this invention is not limited thereto but may be variously embodied to practice within the scope of the following claims.

I claim:

1. A ferrite toroid retainer for positioning a ferrite toroid on a cable which comprises a toroidal sleeve slideably mounted on said cable, said toroidal sleeve having an inside dimension of substantially equal to the outside dimension of said cable, said toroidal sleeve having an outside diameter substantially equal to the inside diameter of said ferrite toroid, said toroidal sleeve including a retaining ridge attached to and circumscribing each end thereof, and wherein at least one of said retaining ridges has a tapered leading edge to facilitate installing said ferrite toroid on said toroidal sleeve.

2. The ferrite toroid retainer of claim 1 wherein said tapered retaining ridge includes a compression notch formed in the perimeter of said tapered retaining ridge facilitating the installation of said ferrite toroid on said toroidal sleeve.

3. The ferrite toroid retainer of claim 2 further having a longitudinal slot disposed parallel to the longitudinal axis of said toroidal sleeve for facilitating installation of said ferrite toroid retainer on a cable.

4. The ferrite toroid retainer of claim 3 being made of an elastomer.

5. The ferrite toroid retainer of claim 1 is made of an elastomer.

6. A ferrite toroid retainer for stationary engagement of a ferrite toroid on a cable comprising a toroidal sleeve having an inside diameter slightly larger than the outside diameter of said cable, said toroidal sleeve having an outside diameter slightly larger than the inside diameter of said ferrite toroid, said toroidal sleeve including a retaining ridge attached to and circumscribing each end thereof, said retaining ridges each having tapered leading edges and a separation in their circumference, said toroidal sleeve further having a longitudinal slot parallel to the longitudinal axis of said toroidal sleeve and disposed along the entire length of said toroidal sleeve for facilitating installation of said toroidal sleeve on a cable and enhancing frictional engagement of said cable when fitted with said ferrite toroid, said separation in the circumference of each retaining ridge corresponding to and coincident with said longitudinal slot.

7. The ferrite toroid retainer of claim 6 wherein said tapered retaining ridge includes a compression notch formed in the perimeter of said tapered retaining ridge facilitating the installation of said ferrite toroid on said toroidal sleeve.

8. The ferrite toroid retainer of claim 7 being made of an elastomer.

9. A ferrite toroid retainer for positioning a ferrite toroid on a cable comprising a toroidal sleeve slideably mounted on said cable, said toroidal sleeve having an inside dimension substantially equal to the outside dimension of said cable and having an outside diameter substantially equal to the inside diameter of said ferrite toroid, said toroidal sleeve being fabricated of an elastomer.

* * * * *